United States Patent [19]

Sato et al.

[11] 4,229,756
[45] Oct. 21, 1980

[54] ULTRA HIGH SPEED COMPLEMENTARY MOS DEVICE

[75] Inventors: Shuichi Sato, Beaverton; Tadanori Yamaguchi, Hillsboro; Jack Sachitano, Portland, all of Oreg.

[73] Assignee: Tektronix, Inc., Beaverton, Oreg.

[21] Appl. No.: 10,665

[22] Filed: Feb. 9, 1979

[51] Int. Cl.² .......................... H01L 27/02
[52] U.S. Cl. .................... 357/42; 357/23; 357/41; 357/46; 357/55; 357/56
[58] Field of Search .............. 357/23, 41, 42, 46, 357/55, 56

[56] References Cited

U.S. PATENT DOCUMENTS

| | | | |
|---|---|---|---|
| 3,823,352 | 7/1974 | Pruniaux et al. | 357/56 |
| 4,063,274 | 12/1977 | Dingwall | 357/53 |

OTHER PUBLICATIONS

Electronics–Dec. 7, 1978, pp. 41-42.

Primary Examiner—Edward J. Wojciechowicz
Attorney, Agent, or Firm—John D. Winkelman

[57] ABSTRACT

An improved, ultra high speed (2GHz) CMOS inverter structure comprising a double-diffused, planar p-channel transistor and a nonplanar n-channel transistor formed within adjacent surface fields on the same substrate. The n-channel device includes a source region formed in an elevated, plateau region on the substrate, and a narrow, implanted channel-forming layer that extends through the plateau beneath the source region and terminates at a slope joining the plateau to surrounding lower elevation portions of the substrate. A drain region is formed adjacent the foot of the slope, spaced from the channel to provide a drift region between them.

8 Claims, 9 Drawing Figures

ULTRA HIGH SPEED COMPLEMENTARY MOS DEVICE

BACKGROUND OF THE INVENTION

The present invention relates generally to metal-oxide-semiconductor (MOS) field effect devices, and more particularly to an improved, ultra high speed complementary MOS structure adapted for large scale integration (LSI).

Integrated circuit technology has been characterized in recent years by a continued push for higher circuitry density to permit greater levels of integration. Most of the development activity has involved metal-oxide-semiconductor technology. With the growing use of large and very large scale integration, complementary metal-oxide-semiconductor (CMOS) circuits have experienced increased interest because of their extremely low "standby" power consumption and high noise immunity.

Complementary MOS devices combine p-channel and n-channel enhancement mode transistors on a common substrate, the basic circuit in CMOS logic being a complementary inverter (FIG. 2). One prior art technique for achieving greater circuit density is device scaling—simply reducing the dimensions of standard CMOS device. Scaling down the dimensions of a semiconductor device also increases its speed and reduces its power dissipation. Another known approach is to make the n-channel half of the complementary structure using one of the newer, high performance n-MOS technologies. For instance, a CMOS integrated circuit consisting of a double-diffused planar metal-oxide-semiconductor (DMOS) n-channel device and a standard metal gate p-channel device is described by Masuhara et al. in IEEE J. Solid-State Circuits, Vol. SC-11, No. 4, pp. 453-8 (August, 1976). In addition, certain high performance n-MOS processes have been adapted to the fabrication of complete CMOS devices. U.S. Pat. No. 3,821,776 to Hayashi et al. describes a complementary DMOS structure, for example, and U.S. Pat. No. 4,131,907 to Ouyang shows a complementary V-groove MOS device. A CMOS structure consisting of a p-channel DMOS transistor and an n-channel double-diffused VMOS transistor is the subject of a paper by Jhabvala et al. in IEEE Trans. Electron Devices, Vol. ED-25, No. 7, pp. 848-50 (July, 1978).

These prior art CMOS structures have certain drawbacks, however. For example, it is difficult to manufacture very high performance devices solely by scaling down conventional planar structures because of the need to form extremely fine patterns accurately and reproducibly. In addition, planar technologies require more substrate surface area than equivalent performance nonplanar MOS devices. The production of V-groove structures requires a special, high cost anisotropic etching process. And while vertical channel VMOS has a compact configuration, it has circuit limitations when used in LSI applications. Lateral channel VMOS devices, such as those used in Ouyang and Jhabvala et al. CMOS structures, have relatively long drift regions, increasing their source-to-drain resistance.

Accordingly, a principal object of the present invention is to provide a new, very high performance CMOS structure. A related object is to provide an improved complimentary MOS device that is free of the disadvantages associated with prior art CMOS structures.

SUMMARY OF THE INVENTION

These and other objects of the invention are achieved in a novel CMOS structure that includes a double-diffused, planar p-channel device and a nonplanar n-channel device similar in configuration to the type disclosed in application Ser. No. 862,715, filed Dec. 21, 1977 by Shuichi Sato et al. and assigned to the assignee of the present invention.

In accordance with an illustrated embodiment, such a structure suitably comprises a semiconductor substrate body predominantly of n-type material containing isolated wells of p— epitaxial material. One well underlies and opens into a planar field of the substrate surface containing the p-channel half of the CMOS structure. The p-channel enhancement mode device includes a p+ source region and a surrounding n-type channel region formed along one side of the well by a double implant/diffusion technique. A p+ drain region is located along the opposite side, spaced from the channel to provide a drift region within the p— well. Another, adjacent well is disposed beneath a nonplanar field of the surface that includes a plateau and an adjoining slope. The n-channel half of the CMOS structure is contained within the perimeter of this well and includes an n+ source region within the plateau. Adjacent the source region is a narrow channel region formed by a thin, implanted p-type layer having an upturned edge that terminates at the slope. An n+ drain region is located within a lower elevation portion of the substrate near the foot of the slope, and an n— drift region extends from it to the channel region. Overlying the channel and drift region of each transistor is a silicon gate electrode separated from the substrate body by a thin oxide layer. The gates of both devices are connected together and used as the digital signal input in inverter operation. A metallization pattern interconnecting both drains serves as the output.

DESCRIPTION OF PREFERRED EMBODIMENT

Figure 1:
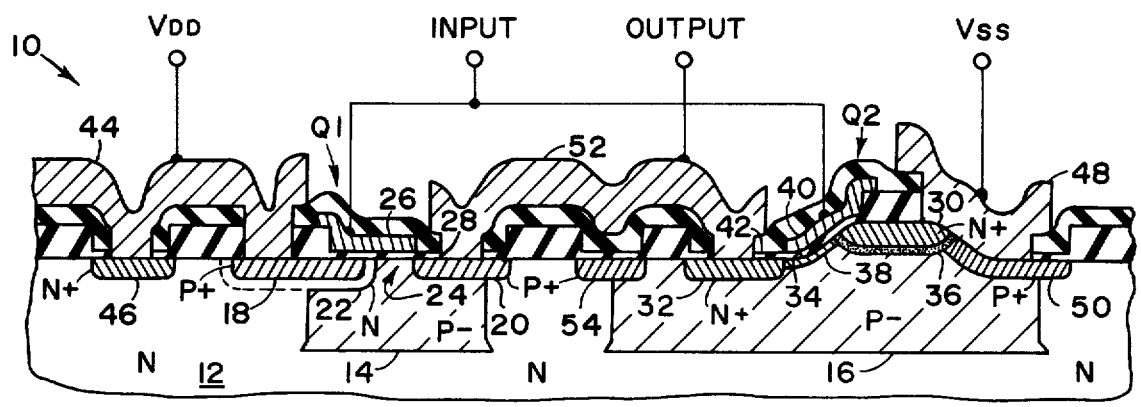
FIG. 1 is a cross-sectional view of a complementary MOSFET structure according to a preferred embodiment of the present invention.

Referring now to the drawings, and first to FIG. 1 thereof, a CMOS field effect transistor structure in accordance with the best mode presently contemplated for practicing the invention is shown in cross-section at 10. Transistor structure 10 is in the form of a complementary inverter and includes a pair of enhancement mode MOS transistors—a planar p-channel device Q1 of the double-diffused, self-aligned (DMOS) type and a nonplanar n-channel device Q2 of the type disclosed in the above-mentioned Sato et al. application. Transistors Q1 and Q2 are formed at the upper surface of an n-type silicon substrate 12 that includes a pair of p— wells 14, 16. Substrate 12 suitably has a bulk resistivity of about 2 to 3 ohm-cm. Wells 14, 16, which preferably are of epitaxially-deposited material to provide a uniform, accurately controlled impurity level, suitably have a resistivity of about 15 to 20 ohm-cm.

P-channel transistor Q1 is located within a substantially planar field of the substrate surface that contains the opening of well 14. Extending into substrate 12 along opposite sides of the well as shown are shallower but more highly doped p+ regions 18, 20, which respectively serve as source and drain regions for the device. A very narrow (about 0.8 to 1.5 microns) n-type region 22 surrounding source region 18 serves as the channel region for transistor Q1. Channel-forming region 22, which is spaced from drain region 20 to provide a drift region 24 in well 14, is produced by a conventional double diffusion self-alignment technique. Overlying the channel and drift region is a conductive layer 26, preferably at heavily doped polycrystalline silicon (polysilicon) that serves as the transistor's gate. A thin silicon dioxide dielectric layer 28 insulates the polysilicon gate from the underlying surface of substrate 12.

N-channel transistor Q2 is disposed at an adjacent nonplanar surface field within the perimeter of p− well 16. Extending into a higher elevation or plateau portion of substrate 12 within the nonplanar field is an n+ source region 30. An n+ drain region 32 extends into well 16 at a lower elevation location adjacent the foot of a slope 34 along one side of the plateau. Extending through the plateau just beneath source region 30 is a very thin (about 0.3 to 0.9 micron) implanted p-type layer 36. The implanted layer has a profile that essentially is a complement of the overlying substrate surface, and thus includes an upturned margin that terminates along slope 34 and forms a channel for the device. Extending along the surface of the slope between the termination of channel-forming layer 36 and drain region 32 is an implanted n− drift region 38. A conductive layer 40, preferably of heavily doped polysilicon, overlies the channel and drift region and serves as the gate of transistor Q2. Separating the gate from the surface of substrate 12 is a thin layer 42 of silicon dioxide.

Structure 10 further includes a metallization pattern layer 44 in contact with Q1 source region 18, and with an n+ region 46 extending into substrate 12 outside well regions 14, 16, suitably at a location adjacent channel forming layer 22 as shown. Region 46 provides an ohmic contact to the substrate (and hence to the channel of Q1) for metal layer 44, which is connected in a suitable manner to a positive voltage (Vdd) source for operation of the device. A second metallization pattern layer 48 makes contact with source region 30 and channel-forming layer 36 in transistor Q2, as well as to a p+ region 50 providing an ohmic connection to well 16. Metal layer 48 is connected to Vss, or ground.

Figure 2:
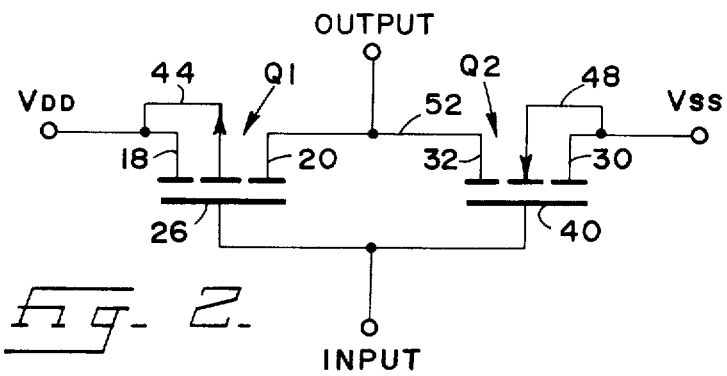
FIG. 2 is an electrical schematic diagram of the structure shown in FIG. 1.

The gates of transistors Q1 and Q2 are interconnected by a conductive pattern (not shown), to which digital input signals are applied. Inverted output signals are taken from a third metallization pattern layer 52 interconnecting drain regions 20 and 32 of the two transistors. FIG. 2 shows the interconnecting gates 26 and 40 of the two transistors. FIG. 2 shows the resulting arrangement in electrical schematic form.

It will be noted in FIG. 1 that the gate electrodes (26, 40) of Q1 and Q2 overlap a portion of the respective transistor's source region. This is done to maximize tranconductance at microwave frequencies. Overlap of the drain regions preferably is avoided, however. Structure 10 further includes a p+ "channel stopper" region 54 adjoining the surface of substrate 12 along the border of well 16 to provide improved isolation between the two transistors. For the same reason, p+ regions 20 and 50 also extend from p− wells 14, 16, respectively, into adjoining n-type portions of substrate 12.

Figure 3:
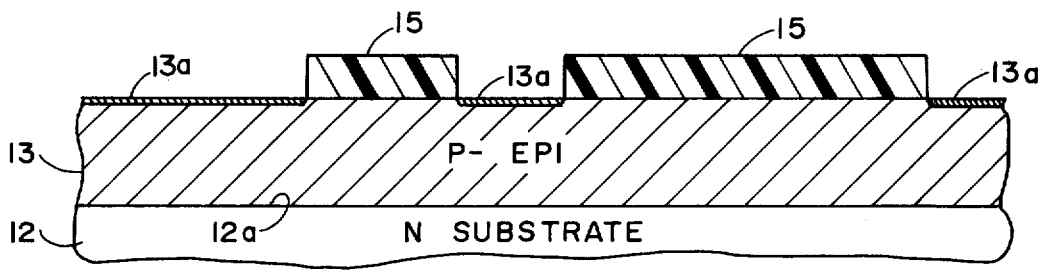
FIGS. 3-9 are cross-sectional views of successive stages in the manufacture of the FIG. 1 structure.

Referring now to FIGS. 3-9, a process for making the silicon gate CMOS integrated circuit device of FIG. 1 will be described. As will be understood, the figures are intended only to be illustrative and are not drawn to scale. The starting material is a wafer of n-type [100] oriented monocrystalline silicon having a resistivity of about 2 to 3 ohm-cm. Substrate, or body, 12 in the figures represents only a very small portion of the wafer, chosen as a representative cross-section. After appropriate cleaning, an epitaxial layer 13 of p− conductivity is grown on the upper surface 12a of the substrate. Layer 13 preferably has a thickness of about 5 microns and a resistivity of about 15 to 20 ohm-cm. Following the epitaxial deposition step, a coating of photoresist is applied to the upper surface of layer 13, then patterned to provide a mask 15 covering portions of the surface at desired locations for p− wells 14, 16. The masked wafer is next subjected to an ion implanation step in which phosphorus ions are implanted in unprotected areas 13a of the epi layer. A phosphorus ion dosage of about 1 to $10 \times 10^{13}/cm^2$ (typically about $8 \times 10^{13}/cm^2$) at 100 KeV is suitable. The structure at this stage is shown in FIG. 3.

Figure 4:
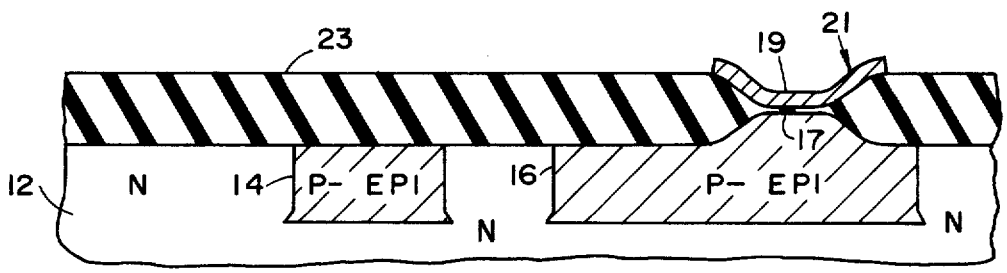

After the phosphorus implant, photoresist mask 15 is removed and the surface etched to remove any oxidation. The surface of the silicon is then reoxidized to produce an oxide layer 17 about 500 angstroms thick. An oxygen impermeable layer 19 of silicon nitride ($Si_3N_4$) is deposited on the oxide layer to a thickness of about 1300 angstroms, after which about 5000 angstroms of silicon dioxide is formed on the $Si_3N_4$ layer by chemical vapor deposition (CVD). The silicon oxide and nitride layers are pattern etched to provide a mask 21 covering an area of epitaxial layer 13 where a plateau is to be subsequently formed. A very thick (about 2 microns) oxide layer 23 is then grown in the unprotected areas of layer 13 by subjecting the wafer to an oxidizing atmosphere at about 1000° C. for 24 hours. A portion of the silicon surface is consumed in the oxidation process, lowering the surface of the wafer outside the area protected by mask 21. As is known, local oxidation of a silicon surface masked by a nitride-oxide duplex layer (i.e. layers 17, 19) produces oxide "beaks" that extend beneath the margin of the oxygen impermeable $Si_3N_4$ layer as shown in FIG. 4. These beaks provide a smoothly tapered transition in thickness between local oxide layer 23 and the thin oxide layer 17 beneath mask 21. Their formation is described by Appels et al. in Philips Research Reports, Vol. 26, No. 3, pp. 157-165. During the local oxidation step, the phosphorus ions previously implanted in areas 13a diffuse down through the p− epitaxial layer, counterdoping and converting the underlying regions of layer 13 to n-type conductivity and thereby forming isolated p− wells 14, 16 as shown in FIG. 4.

Figure 5:
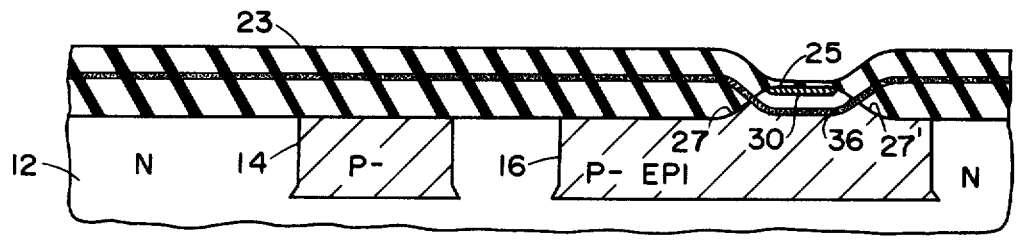

Following the local oxidation step, nitride layer 19 is removed and a very thin layer 36 of p-type impurity is implanted in the wafer and its oxide layer 23. As shown in FIG. 5, the contour of the implanted layer substantially matches the upper surface contour of the oxide coating. By controlling the penetration in a known manner, p-type ions are implanted at a depth such that layer 36 extends through plateau 25 created by the local oxidation step, crossing surface slopes 27, 27'. The p-type layer suitably is formed by implanting boron ions at 200 KeV with a dosage of about $8 \times 10^{12}/cm^2$. Next, an n-type impurity, suitably arsenic, is implanted in plateau 25 to form an n+ source region 30 overlying layer 36. By adjusting the accelerating potential, the arsenic ions are made to penetrate the thin oxide layer 17 overlying plateau 25, but not the thicker local oxide layer 23. An arsenic dosage of about $1 \times 10^{16}/\text{cm}^2$ at 200 KeV is suitable.

Figure 6:
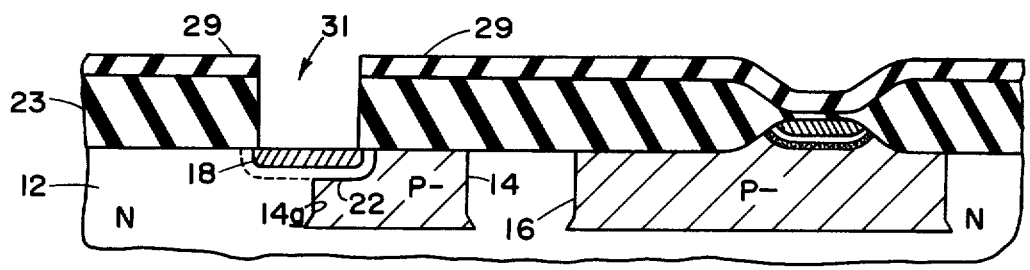
Figure 7:
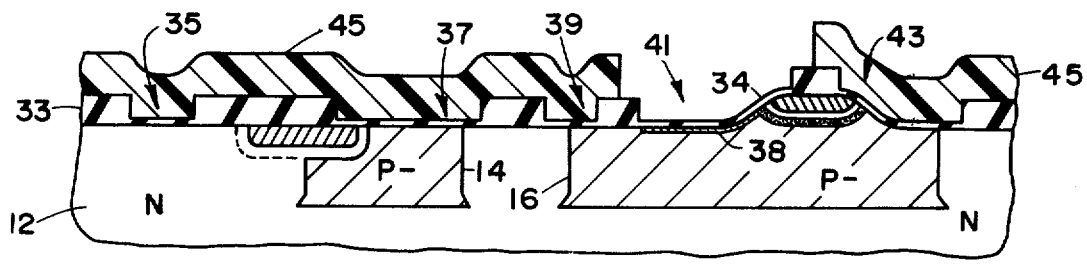
Figure 8:
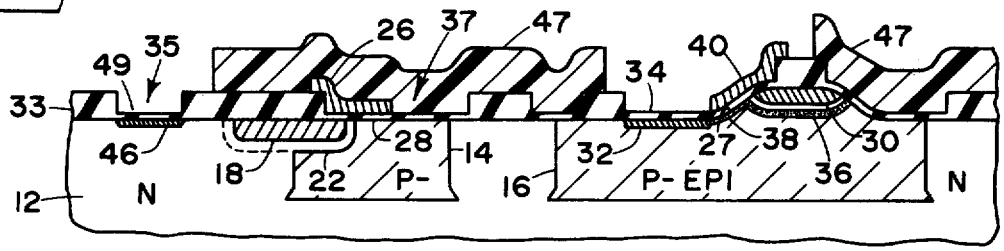

Referring next to FIG. 6, a CVD silicon dioxide layer 29 is deposited over the entire surface of the wafer to a thickness of about 5000 angstroms. An opening 31 is then photoetched through oxide layers 29 and 23 to expose an area of the wafer surface overlying an edge 14a of p— well 14 as shown. The exposed area is then subjected to a phosphorus implant at 100 KeV with a dosage of about $3 \times 10^{11}/\text{cm}^2$. After diffusing the phosphorus to form an n-type region 22 that extends into well 14, boron is implanted in the exposed area of the wafer surface at 30 KeV to a dosage of about $1 \times 10^{16}/\text{cm}^2$ to form a p+ source region 18 within region 22. As will be understood, the difference between the extents of diffusion of the phosphorus and boron implants determines the final width of the channel-forming n-type region surrounding source region 18. This width suitably is on the order of 0.8 to 1.5 microns in the described embodiment.

Oxide layers 23, 29 are removed by etching, after which the entire surface of the wafer is covered with CVD silicon dioxide layer 33 having a thickness of about 1.0 micron. Openings are photoetched in the oxide layer to expose the wafer surface at locations selected for additional impurity implants, these locations/openings being indicated at 35, 37, 39, 41 and 43 in FIG. 7. Next, a thin (about 500 angstroms) oxide film is thermally grown over the surface areas exposed by the openings in layer 33. A photoresist masking layer 45 is formed on the wafer, leaving oxide film 34 within opening 41 uncovered. A thin n— region 38 is formed in the wafer surface beneath film 34 by the implantation of phosphorus ions at 100 KeV to a dosage of about $15 \times 10^{11}/\text{cm}^2$.

After removing the photoresist layer, polycrystalline silicon is deposited on the oxide-covered surface to a thickness of about 5000 angstroms and photoetched to provide polysilicon strips 26 and 40 (FIG. 8) that will ultimately become gate electrodes for transistors Q1 and Q2. As will be seen in the figure, gate-forming strip 26 is disposed on oxide film 28 within opening 37 in oxide layer 33, overlying the surface termination of channel-forming region 22 and adjacent portions of source region 18 and well 14. Polysilicon strip 40 is disposed on slope 27 and overlies the surface termination of implanted layer 36 and adjacent portions of source region 30 and n— region 38. Another photoresist masking layer 47 is formed on the wafer, leaving polysilicon strip 40 and the remaining portion of oxide layer 34 is uncovered, as well as the oxide film 49 in opening 35. Arsenic ions are then implanted in the unmasked areas at a potential of 200 KeV and a dosage of about $1 \times 10^{16}/\text{cm}^2$. The arsenic ions penetrate the thin oxide films, forming n+ regions 32 and 46 underlying oxide films 34 and 49, respectively. In addition, the arsenic ions implanted in polysilicon strip 40 make it highly conductive.

Figure 9:
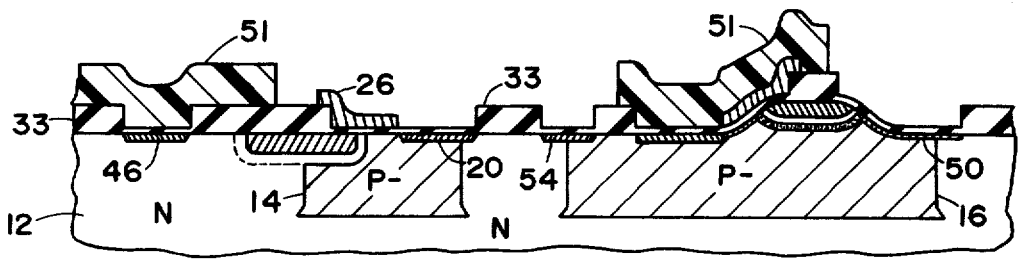

Referring to FIG. 9, masking layer 47 is removed and a new photoresist masking layer 51 is formed on the wafer covering the areas that were left uncovered by the preceding photoresist layer. An implantation of boron ions at 60 KeV at a dosage of about $1 \times 10^{16}/\text{cm}^2$ renders polysilicon strip 26 conductive and forms p+ regions 20, 50 and 54 beneath the oxide films covering the wafer surface in the unprotected areas. After removing masking layer 51, silicon dioxide is coated over the entire surface of the wafer by chemical vapor deposition to a thickness of about 6000 angstroms. Following deposition of the $SiO_2$ coating, the wafer is annealed in a dry nitrogen atmosphere at 1000° C. for about 30 minutes to heal damage to the silicon wafer's crystalline structure caused by the ion implantation, and to diffuse and distribute the implanted arsenic and boron ions. Subsequently, a photoetching operation opens windows in the oxide layers on the wafer at locations where electrical contacts are to be formed. A layer of aluminum is deposited over the entire wafer to a thickness of about 1.5 microns, then etched away to provide the desired pattern of metallization layers, including layers 44, 48 and 52 (FIG. 1).

The thus-described integrated circuit structure includes a combination of very short channel (about 0.3 to 1.5 microns) MOS devices in a complementary structure that provides speed and performance comparable to n— channel MOS FETs. Gate threshold voltages in the range of about 0.8 to 1.0 volts and transconductances of about 200 to 500 micromhos for each device may be achieved, yielding a maximum theoretical speed of about 2 GHz.

While the best mode presently contemplated for practicing the invention has been described with reference to a specific embodiment, various modifications and changes will no doubt become apparent to persons skilled in the art. It is therefore intended that the appended claims will cover any such modification as fall within the true scope of the invention.

We claim as our invention:

1. A semiconductor device comprising:
   a body of semiconductor material having a major surface,
   a first metal-insulator-semiconductor field effect transistor formed at a location on said body surface that includes portions of relatively higher and lower elevation joined by a slope,
   said first transistor including a first region of one conductivity type extending into said body at said higher surface portion and a second region of the same conductivity extending into said body at said lower surface portion, said first and second regions constituting source and drain regions for the transistor, a thin, implanted layer of the opposite conductivity type having an edge that terminates along said slope intermediate said first and second regions and constitutes a channel region for the transistor, an insulating layer disposed over a portion of the body surface including the region thereof extending between said first and second regions, first and second electrodes making electrical contact with said souce and drain regions, respectively, and a gate electrode disposed on said insulating layer overlying at least the portion of said slope that includes said channel region,
   a second, complementary metal-insulator-semiconductor field effect transistor of the double diffusion self-aligned type formed at an adjacent location on said body surface, the surface at said adjacent location being substantially planar,
   said second transistor including a spaced-apart pair of regions of said opposite conductivity type extending into said body and constituting source and drain regions for said second transistor, a narrow region of said one conductivity type surrounding said source region, said narrow region being formed by a double diffusion technique and constituting a channel region for said second transistor, an insulating layer disposed over a portion of the body surface including the region thereof extending between said source and drain regions, third and fourth electrodes making electrical contact with said source and drain regions, respectively, and a gate electrode disposed on said insulating layer overlying at least the portion of said surface that includes said channel region.

2. A semiconductor device comprising:

a body of semiconductor material having a major surface, said body being predominantly of one conductivity type and including first and second spaced-apart well regions of the opposite conductivity type extending into the body from said surface, a first metal-insulator-semiconductor field effect transistor formed at a location on said body surface lying within said first well region, said location including surface portions of relatively higher and lower elevation joined by a slope, said first transistor including a first region of said one conductivity type extending into said body at said higher surface portion and a second region of the same conductivity extending into said body at said lower surface portion, said first and second regions constituting source and drain regions for the transistor, a thin, implanted layer of said opposite conductivity type having an edge that terminates along said slope intermediate said first and second regions and constitutes a channel region for the transistor, said layer being more highly doped than said first well region, an insulating layer disposed over a portion of the body surface including the region thereof extending between said first and second regions, first and second electrodes making electrical contact with said source and drain regions, respectively, and a gate electrode disposed on said insulating layer overlying at least the portion of said slope that includes said channel region, a second, complementary metal-insulator-semiconductor field effect transistor of the double diffusion self-aligned type formed at an adjacent location on said body that includes said second well region, the surface at said adjacent location being substantially planar, said second transistor including a spaced-apart pair of regions of said opposite conductivity type extending into said body at opposite sides of said second well region and constituting source and drain regions for said second transistor, said source and drain regions being more highly doped than said well region, a narrow region of said one conductivity type surrounding said source region and separating it from said second well region, said narrow region being formed by a double diffusion technique and constituting a channel region for said second transistor, the region of said well extending between said channel region and said drain region constituting a drift region for said second transistor, an insulating layer disposed on said body surface overlying said channel and drift regions, third and fourth electrodes making electrical contact with said source and drain regions, respectively, and a gate electrode disposed on said insulating layer overlying said channel region.

3. The device of claims 1 or 2 further including first means electrically interconnecting the respective drain regions of said first and second transistors, and second means electrically interconnecting the respective gate electrodes of said transistors.

4. The device of claim 2, wherein said well regions are formed of an epitaxially-deposited semiconductor material.

5. The device of claim 2, wherein said body is predominantly of n-type semiconductor material, and said well regions are of epitaxially-deposited p-type semiconductor material.

6. The device of claim 5, wherein said first transistor is an n-channel enhancement mode device, and said second transistor is a p-channel enhancement mode device.

7. The device of claim 6, wherein said gate electrodes of the first and second transistors are of a polycrystalline silicon rendered conductive by impurity doping.

8. The device of claim 5, wherein said first and second transistors have channel lengths in the range of about 0.3 to about 1.5 microns.

* * * * *